Figure 1:
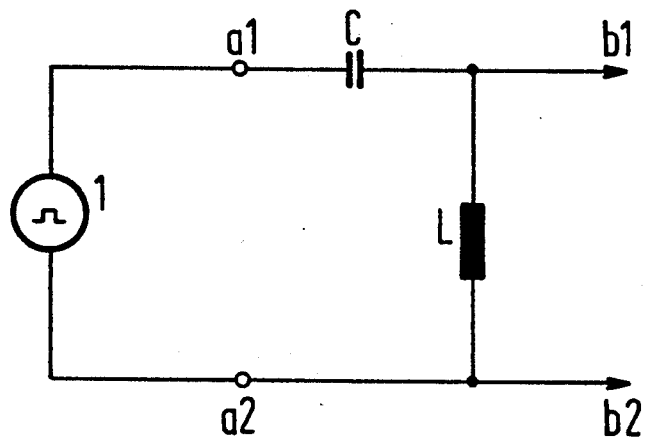

United States Patent [19]

Schatter

[11] Patent Number: 5,019,782

[45] Date of Patent: May 28, 1991

[54] METHOD FOR DETERMINING THE QUALITIES AND/OR FREQUENCIES OF ELECTRICAL TUNED CIRCUITS

[75] Inventor: Eckart Schatter, Zorneding, Fed. Rep. of Germany

[73] Assignee: Siemens Aktiengesellschaft, Berlin and Munich, Fed. Rep. of Germany

[21] Appl. No.: 497,769

[22] Filed: Mar. 20, 1990

Related U.S. Application Data

[63] Continuation of Ser. No. 118,752, Nov. 5, 1987, abandoned.

[30] Foreign Application Priority Data

Nov. 11, 1986 [DE] Fed. Rep. of Germany ....... 3638389

[51] Int. Cl.$^5$ ............................................. G01R 27/28
[52] U.S. Cl. .................................. 324/655; 324/207.26; 324/236; 324/603; 324/605; 328/5; 328/223; 331/65; 361/179
[58] Field of Search ................ 324/655, 654, 656, 652, 324/603, 605, 785, 207.26, 236; 361/179; 328/113, 223, 5; 331/65; 307/116

[56] References Cited

U.S. PATENT DOCUMENTS

| | | | |
|---|---|---|---|
| 3,919,661 | 11/1975 | Buck | 331/65 |
| 4,446,427 | 5/1984 | Lovrenich | 324/207 |
| 4,560,929 | 12/1985 | Melnyk | 324/207 |
| 4,843,259 | 6/1989 | Weisshaupt | 324/207.26 X |

FOREIGN PATENT DOCUMENTS

| | | |
|---|---|---|
| 1287124 | 1/1969 | Fed. Rep. of Germany .......... 328/5 |
| 2356490 | 10/1975 | Fed. Rep. of Germany . |
| 2552310 | 5/1976 | Fed. Rep. of Germany .......... 328/5 |
| 2618231 | 11/1977 | Fed. Rep. of Germany .......... 328/5 |

OTHER PUBLICATIONS

Electronics, vol. 45, No. 21, Oct. 9, 1972, pp. 119–120.
"Electronic Measurements", 2nd Edition, 1952, pp. 332 and 333.
Hewlett-Packard Journal, vol. 28, No. 1, Sep. 1976, pp. 9 and 15.
International Journal of Electronics, vol. 55, Oct. 1983, pp. 625 to 630.
Sensenbaugh, "Proximity Detector", IBM Technical Disclosure Bulletin, vol. 13, No. 18 (Jan. 1971), pp. 2230–2231.

*Primary Examiner*—Kenneth Wieder
*Assistant Examiner*—Robert W. Mueller
*Attorney, Agent, or Firm*—Herbert L. Lerner; Laurence A. Greenberg

[57] ABSTRACT

Method for determining qualities and/or frequencies of electrical tuned circuits. The method includes the steps of exciting the turned circuit with a switching pulse which has a short rise and fall time as compared with a period corresponding to the resonant frequency of the circuit, and evaluating the oscillation dying out after the switching impulse.

1 Claim, 2 Drawing Sheets

METHOD FOR DETERMINING THE QUALITIES AND/OR FREQUENCIES OF ELECTRICAL TUNED CIRCUITS

This application is a continuation, of application Ser. No. 118,752, filed Nov. 5, 1987, now abandoned.

SPECIFICATION:

The invention relates to a method for determining qualities and/or frequencies of electrical tuned circuits.

The qualities and/or frequencies of electrical tuned circuits are measured or determined for a great many applications. For the measurement range, tuned circuit qualities are, for instance, typically determined by determining the quality of the inductor of the tuned circuit, which as a rule substantially determines the quality of the tuned circuit. This is carried out in a bridge by measuring the real and the imaginary or mathematical portions in the bridge at a fixed frequency. This is disadvantageous because as a rule the measurement frequency in the bridge is not equal to the resonant frequency of the tuned circuit in which the inductor will be used.

One instance in which varying tuned circuit qualities occur and are evaluated is an inductive proximity switch. Such an inductive proximity switch is known, for example, from German Patent DE-PS 23 56 490, corresponding to U.S. Pat. No. 3,919,661. In principle, the device is formed by an oscillator and a switching amplifier connected to the output side of the oscillator, which evaluates the amplitude of the oscillation of the oscillator. The principle on which an inductive proximity switch of this kind operates is based on the fact that the frequency-determining tuned circuit of the oscillator is damped or undamped by a ferromagnetic part approaching more or less closely to its inductor. During damping by moving a ferromagnetic part which is moved closer, the amplitude of the oscillator oscillation is low or is no longer existent, while during undamping by moving the ferromagnetic part away, it has a predetermined high value.

On one hand, proximity switches constructed in this way are disadvantageous because oscillators have finite rise times that are also important in practical terms. Accordingly, in the case where an inductive proximity switch is turned on for the first time, a finite and non-negligible period of time elapses until it is operationally ready. For cases in which the oscillator oscillations break off completely, when damping the tuned circuit with the tuned circuit inductor, these problems also rise in steady-state operation, because after undamping the tuned circuit the oscillator once again requires the finite rise time until reaching its steady-state oscillation status. As a result, in steady-state operation of the inductive proximity switch, there are idle periods when switching over from the damped to the undamped state.

It is accordingly an object of the invention to provide a method for determining the qualities and/or frequencies of electrical tuned circuits, which overcomes the hereinaforementioned disadvantages of the heretofore-known methods of this general type.

With the foregoing and other objects in view there is provided, in accordance with the invention, a method for determining qualities and/or frequencies of electrical tuned circuits, which comprises exciting the tuned circuit with a switching pulse having a short rise and fall time as compared with a period corresponding to a resonant frequency of the tuned circuit, and evaluating an oscillation dying out after the switching pulse.

In accordance with another mode of the invention, there is provided a method wherein the tuned circuit is in the form of a series resonant circuit, which comprises forming the switching pulse in the form of a voltage jump from a voltage source, having a low internal resistance as compared with the series resonance loss resistance of the tuned circuit.

In accordance with a further mode of the invention, there is provided a method which comprises picking up the dying out oscillation at an inductor of the series resonant circuit.

In accordance with an added mode of the invention, there is provided a method wherein the tuned circuit is in the form of a parallel resonant circuit, which comprises forming the switching pulse as a voltage jump from a voltage source, having a high internal resistance as compared with the parallel resonance loss resistance of the tuned circuit.

In accordance with an additional mode of the invention, there is provided a method which comprises periodically supplying switching pulses to the tuned circuit.

In accordance with yet another mode of the invention, there is provided a method which comprises carrying out the switching pulses in succession at time intervals long enough to permit the oscillation to sufficiently die out.

In accordance with yet a further mode of the invention, there is provided a method which comprises damping the tuned circuit after the dying out oscillation has been evaluated.

In accordance with yet an added mode of the invention, there is provided a method which comprises switching over the internal resistance of the switching pulse source to a defined value for damping the tuned circuit.

In accordance with yet an additional mode of the invention, there is provided a method which comprises feeding switching pulses of alternating polarity into the tuned circuit, and evaluating the resultant dying out oscillations in pairs.

In accordance with still another mode of the invention, there is provided a method which comprises determining and evaluating the number of the periods in the dying out oscillation that exceed a predetermined amplitude.

In accordance with a concomitant mode of the invention, there is provided a method which comprises determining and evaluating a period of time after the switching pulse in which the dying out oscillations exceed a predetermined amplitude.

Other features which are considered as characteristic for the invention are set forth in the appended claims.

Although the invention is illustrated and described herein as embodied in a method for determining the qualities and/or frequencies of electrical tuned circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
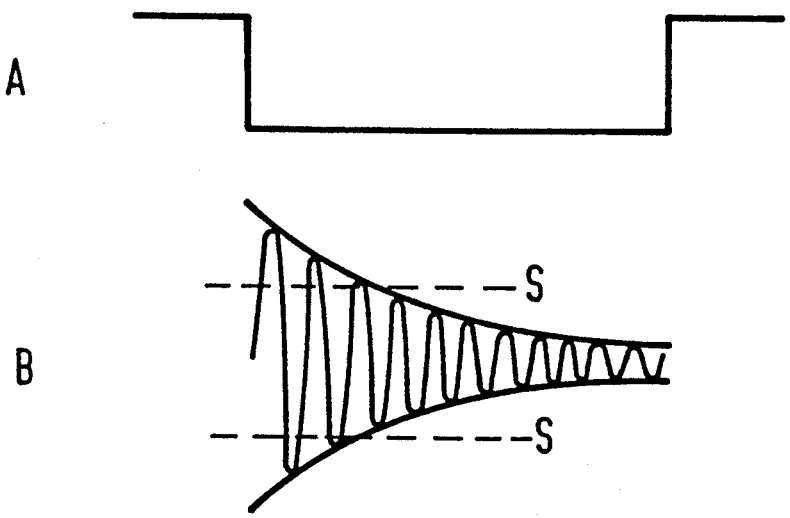
Figure 3:
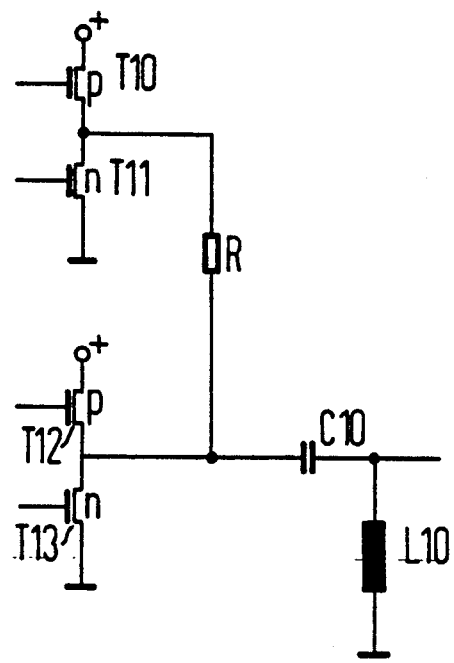
Figure 4:
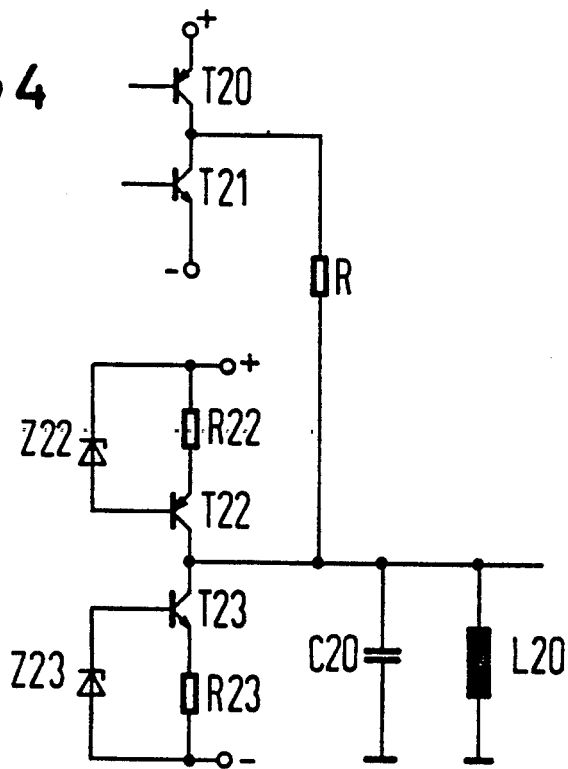

FIG. 1 is a schematic circuit diagram of a basic circuit configuration for performing the method according to the invention;

FIG. 2(A and B) contains diagrams explaining the signal course at various nodes in the basic circuit of FIG. 1;

FIG. 3 is a circuit diagram of a circuit configuration for performing the method according to the invention, having a voltage source supplying a series resonant circuit; and FIG. 4 is a circuit diagram of a circuit configuration for performing the method according to the invention having a current source supplying a parallel resonant circuit.

Referring now to the figures of the drawings in detail, the method according to the invention will be described, first in terms of the basic circuit diagram of FIG. 1 and the signal diagrams of FIG. 2.

As is shown in FIG. 1, a source 1 that furnishes a switching surge or pulse supplies a tuned circuit which is constructed in the form of a series resonance circuit having a capacitor C and an inductor L. The source 1 of FIG. 1 furnishes at least one switching surge or pulse at the nodes a1 and a2, as shown in the signal diagram of FIG. 2A. The switching surge or pulse causes the series resonance circuit formed of the capacitor C and the inductor L to be excited to a decaying or dying out (damped) oscillation as shown in FIG. 2B, which arises at nodes b1 and b2 in the basic circuit of FIG. 1. The decaying or dying out oscillation arising at these nodes can be evaluated using an evaluation circuit E, which is known in the art.

According to the invention, the rise time and decay time of the switching surge or pulse impacting on the tuned circuit as shown in Fig, 2A should be low as compared with the period corresponding to the resonant frequency of the tuned circuit. This is suitable to cause the surge energy delivered to the tuned circuit to be dependent only on the amplitude of the switching surge or pulse, but not on the steepness of the edge of the switching pulse.

In the case of a tuned circuit in the form of a series resonant circuit such as that shown in FIG. 1, the source furnishing the switching surge or pulse is a voltage source that furnishes a voltage jump. The internal resistance of the source is low as compared with the series resonance loss resistance of the tuned circuit. The dimensioning of the internal resistance of the voltage source is therefore selected in such a way that during the decaying or dying out oscillation of FIG. 2B, the tuned circuit is damped only by its own loss resistance, but not by the internal resistance of the voltage source as well.

The decaying or dying out oscillation is suitably picked up at the inductor of the series resonant circuit, because a resonance step-up takes place at this inductor and hence a voltage of sufficiently high amplitude, which is easily evaluated, is available.

According to a further feature of the invention, in the case of a tuned circuit in the form of a parallel resonant circuit, the switching surge or pulse is generated by a current source furnishing a current jump. The internal resistance of the source is high as compared with the parallel resonance loss resistance of the tuned circuit. The dimensioning of the internal resistance of the current source is again selected in such a way that the tuned circuit, which in this case is a parallel resonant circuit, is only damped during the decaying or dying out oscillation shown in FIG. 2B by its own loss resistance, but not by the internal resistance of the current source as well.

In principle, the method according to the invention can only be performed with a single switching surge or pulse and one decaying or dying out oscillation resulting therefrom. This is basically true for example for measuring the quality of a tuned circuit at which a single decaying or dying out oscillation shown in FIG. 2B, upon a single switching surge or pulse shown in FIG. 2A, is evaluated in a manner to be described below.

However, particularly favorable conditions are attained if a tuned circuit is periodically supplied with switching surges or pulses. The switching surges or pulses should succeed one another at time intervals which are long enough to cause the decaying or dying out oscillation resulting from them to be decayed to a sufficient extent. It is thereby assured that the energy in the tuned circuit is determined only by the final switching surge or pulse generating it and no longer by the previous succession of switching surges or pulses. In order to permit a sufficiently high measurement speed to be attained, it is particularly advantageous to damp the tuned circuit after the evaluation of a decaying or dying out oscillation. In fact, it is thus assured that after the evaluation, any energy still remaining in the tuned circuit will be dissipated quickly and dependably.

The damping of the tuned circuit may be carried out, for instance, by switching over the internal resistance of the switching surge or pulse source to a defined value after the decaying or dying out oscillation has been evaluated.

Respective embodiments of device for switching over the internal resistance, both for a voltage source that furnishes a voltage jump and for a current source that furnishes a current jump, are shown in FIGS. 3 and 4.

FIG. 3 shows an embodiment of a voltage source having a reversible internal resistance, which is advantageously monolithic and is preferably integrated by CMOS technology.

The voltage source shown contains two pairs of complementary transistors T10, T11 and T12, T13 connected in series. In order to indicate that the upper transistor of each pair is a p-channel transistor and the lower transistor of each pair is an n-channel transistor, the corresponding symbols are used for the particular transistor. The outputs of the two complementary stages are joined together by means of a resistor R, which carries out the variation of the internal resistance of the voltage source by switching over. The voltage source supplies a tuned circuit in the form of a series resonant circuit including a capacitor C10 and an inductor L10. Arrows in FIG. 1 indicates the connection to an evaluation circuit.

In order to be able to operate the voltage source with a low internal resistance during the generation of the switching surge or pulse and with greater internal resistance after the evaluation of the decaying or dying out oscillation brought about by the switching surge or pulse, the transistors T10–T13 are triggered as follows: During a switching surge or impulse, the transistors T10 and T12 are first made conductive, so that the transistor T12 fixes the internal resistance at a low value, because a conductive path leads from a source of operating voltage, schematically symbolized by a + sign, through the transistor T12 to the series resonant circuit Once the decaying or dying out oscillation caused by this switching surge or pulse has been evaluated, only the transistor T10 is controlled to be conductive, so that a branch once again indicated by a + sign, leads from the operating voltage source through the transistor and the resistor R to the series resonant circuit and the internal resistance of the voltage source which is greater, is determined by the resistor R.

On one hand, in order to reverse the polarity of a switching surge or pulse, the transistors T11 and T13 can be correspondingly controlled to be conductive during the generation of this kind of switching surge or pulse and during the ensuing evaluation of the decaying or dying out oscillation brought about thereby. On the other hand, in order to increase the internal resistance after the evaluation of the decaying or dying out oscillation, only the transistor T11 is controlled to be conductive.

A logic element for suitably triggering the transistors in the manner described above can be constructed in a known manner and the structure thereof in terms of circuitry will be immediately apparent from the above-described triggering sequence of the transistors.

FIG. 4 shows a circuit illustrating the corresponding situation for the reversal of the internal resistance of a current source for supplying a parallel resonant circuit formed by a capacitor C20 and an inductor L20. The circuit configuration, which is preferably constructed in bipolar integrated technology, includes two series-connected complementary transistor pairs T20, T21 and T22, T23, analogously to the embodiment of FIG. 3. In the upper complementary transistor pair T20, T21, each of the emitters is connected to a respective source of operating voltage, indicated by + and − signs, while in the lower complementary transistor pair T22, T23 the emitters are respectively connected through respective emitter resistors R22 and R23 to the positive and negative operating voltage sources. Furthermore, the base of the transistor T22 is connected through a Zener diode Z22 to the positive operating voltage source and the base of the transistor T23 is connected through a Zener diode Z23 to the negative operating voltage source. As in the embodiment of FIG. 3, the resistor R is again the element through which the internal resistance of the current source can be switched over. The parallel resonant resistor is formed of a capacitor C20 and an inductor L20.

In the embodiment of the current source, a switching surge or impulse of one polarity at a time is generated by triggering the transistor T22 or the transistor T23 while the resistor R is switched on, and thus the internal resistance is switched over by making the transistor T20 or the transistor T21 conductive for the particular polarity. A correspondingly constructed logic element which is known for triggering the transistors is also immediately apparent from the triggering sequence of the transistors.

As already mentioned in connection with the embodiments for switching surge or pulse sources shown in FIGS. 3 and 4, the switching surges or pulses can be supplied to the tuned circuit with alternating polarity and the resultant decaying or dying out oscillations are then evaluated in pairs.

The evaluation of the decaying or dying out oscillations can be carried out, for instance, by determining the number of periods in the decaying or dying out oscillation that exceed a predetermined amplitude. Such a predetermined amplitude is indicated in FIG. 2B, for example, by means of a switching threshold S shown in broken lines. In terms of circuitry, the determination of the number of periods that exceed the predetermined amplitude can be performed, for example, by supplying the decaying or dying out oscillation to a Schmitt trigger having the indicated switching threshold S, and the number of reversals that the Schmitt trigger undergoes as a result of amplitudes above the switching threshold S are counted. The determination can then be performed by having the counted value trigger a switching element, for example.

Furthermore, the time period following the switching surge or pulse in which the decaying or dying out oscillations exceed a predetermined amplitude, can also be determined and evaluated. The predetermined amplitude can once again be the switching threshold S of FIG. 2B. In terms of circuitry, this type of evaluation can be provided in a known manner, such as with a counter controlled by a time reference subjected to the decaying or dying out oscillation.

Naturally, it is also possible to combine the determination and evaluation by way of the number of periods in the decaying or dying out oscillation and the time period following the switching surge or pulse, in order, for instance, to determine the resonant frequency of a tuned circuit. Furthermore, in addition to detecting an event, for instance in terms of the type of damping of the resonant circuit of the oscillator of an inductive proximity switch, it thus also becomes possible to determine the value of a physical variable, such as the absolute value of the distance away from a ferromagnetic element that damps the tuned circuit of an oscillator in an inductive proximity switch. Another example of determining the absolute value of a physical variable would be determining the pressure with a barometric cell provided with a diaphragm 0 (FIG. 1) in which the diaphragm is disposed in the vicinity of the inductor of a tuned circuit and in which the particular pressure value can be determined directly from the particular distance between the diaphragm and the inductor at different pressure values in the barometric cell.

I claim:

1. A proximity sensing apparatus for sensing proximity of an electrical tuned circuit with an inductor to an electrically conductive object, the tuned circuit having a given period of resonance, wherein the state of the sensing apparatus depends upon the quality of the tuned circuit, and wherein the quality of the tuned circuit depends upon the distance between said inductor and the electrically conductive object; comprising means for exciting the tuned circuit with an electrical pulse having short rise and fall times compared with said period; means for evaluating decay of oscillations in said tuned circuit after the end of the pulse; means for periodically supplying pulses to the tuned circuit; means for feeding pulses of alternating polarity to the tuned circuit; evaluating the resultant decay of the oscillations in pairs; and means for determining the proximity on the basis of said decay.

* * * * *